(12) United States Patent
Park et al.

(10) Patent No.: US 12,486,433 B2
(45) Date of Patent: Dec. 2, 2025

(54) DISPLAY DEVICE (71) Applicant: SAMSUNG DISPLAY CO., LTD., Yongin-si (KR)

(72) Inventors: Eun Kyung Park, Seoul (KR); Gil Yeong Park, Anyang-si (KR); Jung Yeong Seol, Cheonan-si (KR); You Gyoung Lee, Changwon-si (KR); Ji Hwa Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 527 days.

(21) Appl. No.: 17/341,175

(22) Filed: Jun. 7, 2021

(65) Prior Publication Data

US 2022/0105706 A1 Apr. 7, 2022

(30) Foreign Application Priority Data

Oct. 6, 2020 (KR) ........................ 10-2020-0128763

(51) Int. Cl.
| | |
|---|---|
| *C09J 7/29* | (2018.01) |
| *B32B 7/12* | (2006.01) |
| *B32B 27/28* | (2006.01) |
| *C09J 7/10* | (2018.01) |
| *C09J 7/38* | (2018.01) |
| *H05K 5/03* | (2006.01) |

(52) U.S. Cl.
CPC ................ *C09J 7/29* (2018.01); *B32B 7/12* (2013.01); *B32B 27/281* (2013.01); *C09J 7/10* (2018.01); *C09J 7/38* (2018.01); *B32B 2307/42* (2013.01); *B32B 2307/732* (2013.01); *C09J 2203/326* (2013.01); *C09J 2301/302* (2020.08); *C09J 2483/00* (2013.01); *H05K 5/03* (2013.01)

(58) Field of Classification Search
None
See application file for complete search history.

(56) References Cited

U.S. PATENT DOCUMENTS

| | | | | |
|---|---|---|---|---|
| 5,298,328 | A | * | 3/1994 | Abe .................... H01L 23/295 |
| | | | | 523/209 |
| 2002/0153824 | A1 | * | 10/2002 | Chigusa ................ H01J 29/896 |
| | | | | 313/477 R |
| 2013/0071672 | A1 | | 3/2013 | Li et al. |
| 2014/0186605 | A1 | | 7/2014 | Kim et al. |
| 2017/0200915 | A1 | | 7/2017 | Lee et al. |
| 2018/0088392 | A1 | | 3/2018 | Park et al. |
| 2018/0166652 | A1 | | 6/2018 | Kim et al. |
| 2019/0107866 | A1 | | 4/2019 | Han et al. |
| 2019/0225842 | A1 | | 7/2019 | Kimura et al. |
| 2019/0235690 | A1 | * | 8/2019 | Lee ...................... G06F 3/0416 |
| 2020/0152715 | A1 | | 5/2020 | Hao et al. |
| 2020/0224061 | A1 | | 7/2020 | Oh et al. |

FOREIGN PATENT DOCUMENTS

| | | |
|---|---|---|
| CN | 103911081 A | 7/2014 |
| CN | 107867030 A | 4/2018 |
| CN | 110603301 A | 12/2019 |
| CN | 111554192 A | 8/2020 |
| JP | 2019-077750 A | 5/2019 |
| KR | 10-1712749 B1 | 3/2017 |
| KR | 10-1780542 B1 | 9/2017 |
| KR | 10-2018-0018925 A | 2/2018 |
| KR | 10-2018-0033016 A | 4/2018 |
| KR | 20180066378 A | 6/2018 |
| KR | 20190040518 A | 4/2019 |

OTHER PUBLICATIONS

Chinese Office Action for CN Application No. 202111113187.2, dated Jul. 17, 2025, 6 pages.

* cited by examiner

*Primary Examiner* — Sheeba Ahmed
(74) *Attorney, Agent, or Firm* — Womble Bond Dickinson (US) LLP (57) ABSTRACT The present disclosure relates to a display device including a display panel, a protection layer on the display panel, and a first adhesive layer between the display panel and the protection layer. The first adhesive layer may contain 0.05 wt % to 1 wt % of a silane coupling agent, and the first adhesive layer may have creep of 20% or less at 60° C.

19 Claims, 5 Drawing Sheets

DISPLAY DEVICE

CROSS-REFERENCE TO RELATED APPLICATION

This application claims priority to and the benefit of Korean Patent Application No. 10-2020-0128763, filed in the Korean Intellectual Property Office on Oct. 6, 2020, the entire contents of which are hereby incorporated by reference.

BACKGROUND

1. Field

Embodiments of the present disclosure relate to a display device, and, for example, to a display device including an adhesive layer including a silane coupling agent.

2. Description of the Related Art

Recently, with the development of display-related technology, display devices that can be deformed during use stage, such as by folding, rolling (e.g., rolling in a roll shape), or stretching (e.g., stretching like a rubber band), have been researched and developed. Because these displays can be modified in various forms, it is possible to satisfy both a demand for enlarging the display and the demand for downsizing the display for portability at the use stage.

When a display device is folded, significant stress is concentrated in the folded portion, and constituent elements of the display device may be lifted off or damaged in a corresponding area. In addition, a constituent element, such as an adhesive layer of the display device, may be pressed or stamped during a manufacturing process of the display device.

The above information disclosed in this Background section is only for enhancement of understanding of the background of the invention and, therefore, it may contain information that does not form the prior art that is already known in this country to a person of ordinary skill in the art

SUMMARY

One or more embodiments of the present disclosure provide a display device including an adhesive layer having high reliability and low creep at a high temperature.

One or more embodiments of the present disclosure provide a display device including: a display panel; a protection layer on the display panel; and a first adhesive layer between the display panel and the protection layer, wherein the first adhesive layer contains 0.05 wt % to 1 wt % of a silane coupling agent, and the first adhesive layer has creep of 20% or less at 60° C.

The silane coupling agent may include a compound represented by following Chemical Formula 1:

Chemical Formula 1 wherein R' may indicate one selected from a C1 to C10 alkyl, vinyl, carboxyl, glycidyl, epoxy, glycidyl, amino, mercapto, acrylic, methacrylic, primary amine, secondary amine, tertiary amine, and quaternary amine, and each R may independently indicate one selected from hydrogen, a C1 to C10 alkyl, aryl, alkylaryl, arylalkyl, alkenyl, cycloalkenyl, alkene, alkylene, arylene, alkylarylene, arylalkylene, and cycloalkylene.

A thickness of the first adhesive layer may be in a range of 25 μm to 100 μm.

The display panel may further include a display layer, a window, and a hard coating layer, and the hard coating layer and the first adhesive layer may directly contact each other.

The display device may further include a second adhesive layer between the display layer and the window, and the hard coating layer and the first adhesive layer may have different compositions.

The first adhesive layer may be at an uppermost end of a plurality of adhesive layers included in the display device.

The first adhesive layer may include a pressure sensitive adhesive (PSA).

The window may contain a polyimide, and the first adhesive layer may have a peel force of 500 gf/in or more with respect to the window at room temperature (25° C.).

The first adhesive layer may have a peel force of 514 gf/in to 574 gf/in at room temperature (25° C.) with respect to the window.

The window may contain a polyimide, and the first adhesive layer may have a peel force of 300 gf/in or less with respect to the window at 60° C.

The first adhesive layer may have a peel force of 267 gf/in to 287 gf/in at 60° C. with respect to the window.

The first adhesive layer may have a storage modulus of 0.02 MPa to 0.035 MPa at 60° C.

A transition temperature of the first adhesive layer may be −30° C. or less.

The first adhesive layer may be a double-sided adhesive layer.

The display device may be foldable.

A radius of curvature of the foldable display device may be 1.5 R or more.

The display device may further include: a polarization layer between the display layer and the window; a third adhesive layer between the display layer and the polarization layer; a film layer on a surface of the display layer; and a fourth adhesive layer between the display layer and the film layer.

Compositions of the third and fourth adhesive layers may be different from that of the first adhesive layer.

The display device may further include: a cushion layer on a surface of the display layer; and a fifth adhesive layer to attach the cushion layer and the display panel, wherein the hard coating layer and the first adhesive layer may have different compositions.

One or more embodiments of the present disclosure provides a display device including: a display panel; a protection layer on the display panel; and a first adhesive layer between the display panel and the protection layer, and the first adhesive layer may contain 0.05 wt % to 1 wt % of a compound represented by Chemical Formula 1, and the first adhesive layer may have creep of 20% or less at 60° C.:

Chemical Formula 1 wherein R' may indicate one selected from a C1 to C10 alkyl, vinyl, carboxyl, glycidyl, epoxy, glycidyl, amino, mercapto, acrylic, methacrylic, primary amine, secondary amine, tertiary amine, and quaternary amine, and each R may independently indicate one selected from hydrogen, a C1 to C10 alkyl, aryl, alkylaryl, arylalkyl, alkenyl, cycloalkenyl, alkene, alkylene, arylene, alkylarylene, arylalkylene, and cycloalkylene.

According to embodiments of the present disclosure, it is possible to provide a display device including an adhesive layer having high reliability at low creep and a high temperature.

DETAILED DESCRIPTION

The subject matter of the present disclosure will be described more fully hereinafter with reference to the accompanying drawings, in which embodiments of the disclosure are shown. As those skilled in the art would realize, the described embodiments may be modified in various different ways, all without departing from the spirit or scope of the present disclosure, and which may be combined to arrive at yet additional embodiments.

To clearly describe the subject matter of the present disclosure, parts that are irrelevant to the description may be omitted, and like numerals refer to like or similar constituent elements throughout the specification.

Further, because sizes and thicknesses of constituent members shown in the accompanying drawings may be arbitrarily given for better understanding and ease of description, the present disclosure is not limited to the illustrated sizes and thicknesses. In the drawings, the thicknesses of layers, films, panels, regions, etc., may be exaggerated for clarity. In the drawings, for better understanding and ease of description, the thicknesses of some layers and areas may be exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-sectional view" means when a cross-section taken by vertically cutting an object portion is viewed from the side.

As used herein, expressions such as "at least one of", "one of", and "selected from", when preceding a list of elements, modify the entire list of elements and do not modify the individual elements of the list. For example, throughout the disclosure, the expression "at least one of a, b or c" indicates only a, only b, only c, both a and b, both a and c, both b and c, all of a, b, and c, or variations thereof.

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It will be understood that although the terms "first," "second," etc. may be used herein to describe various components, these components should not be limited by these terms. These components are only used to distinguish one component from another.

An expression used in the singular encompasses the expression of the plural, unless it has a clearly different meaning in the context.

It will be further understood that the terms "comprises" and/or "comprising" used herein specify the presence of stated features or elements, but do not preclude the presence or addition of one or more other features or elements.

Hereinafter, a display device according to one or more embodiments of the present disclosure will be described in more detail with reference to the drawings.

Figure 1:
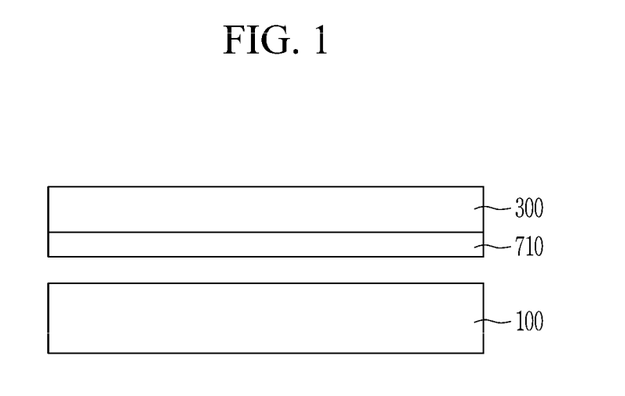
FIG. 1 illustrates a cross-sectional view of a display device according to one or more embodiments.

FIG. 1 illustrates a cross-sectional view of a display device according to one or more embodiments. Referring to FIG. 1, the display device according to one or more embodiments includes a display panel 100 and a protective layer 300 attached to the display panel 100, and the protective layer 300 and the display panel 100 are attached by using a first adhesive layer 710.

In this case, the first adhesive layer 710 may include a pressure sensitive adhesive (PSA). The first adhesive layer 710 may be a double-sided adhesive, and may be used for an uppermost layer in a module structure of the display device. For example, the first adhesive layer 710 may be adhesive at two sides that face away from each other. The first adhesive layer 710 according to one or more embodiments has high peel force at a high temperature and high humidity, and may have low creep. As used herein, the term "creep" indicates deformation that may occur for a specific time when a material is affected by a certain stress under a certain temperature, and when the creep is high, it indicates that there is more deformation at a same stress.

The first adhesive layer 710 may include at least one of polyurethane-based, polyacryl-based, polyester-based, polyepoxy-based, and/or polyvinyl acetate-based materials.

The first adhesive layer 710 according to one or more embodiments may have creep of 20% or less at 60° C. In addition, the first adhesive layer 710 according to one or more embodiments may have a peel force of 500 gf/in (gram-force per inch) or more at room temperature (25° C.) and 300 gf/in or less at 60° C. for a window having polyimide. For example, the first adhesive layer 710 according to one or more embodiments may have a peel force of 514 gf/in to 574 gf/in at room temperature (25° C.) and 267 gf/in or to 287 gf/in at 60° C. In another embodiment, the first adhesive layer 710 may have a peel force of 230 gf/in to 260 gf/in at 60° C. and humidity of 93%.

A thickness of the first adhesive layer 710 may be in a range of 25 μm (micrometers) to 100 μm.

A storage modulus of the first adhesive layer 710 at 60° C. may be in a range of 0.02 MPa (megapascal) to 0.035 MPa. Therefore, it is possible to relieve a stress of other neighboring layers.

In addition, a glass transition temperature of the first adhesive layer 710 may be −30° C. or less. Thus, bending may occur well (e.g., in a suitable or acceptable manner) even at a low temperature.

The first adhesive layer 710 may include a silane coupling agent (SCA). The silane coupling agent, which is a compound that has two or more different reactive groups in a molecule to form a chemical bond between an organic material and/or an inorganic material, is formed to include a reactive group (OR) that chemically bonds with an inorganic substance, and an organic functional group (R) that bonds with a polymer, which serves as a bridge between organic and/or inorganic materials.

The silane coupling agent may include a compound represented by Chemical Formula 1.

R'—Si—(OR)₃    Chemical Formula 1

In Formula 1, R' may indicate an alkyl having 1 to 10 carbon atoms. For example, R' may be selected from methyl, ethyl, vinyl, carboxyl, glycidoxyl, epoxy, glycidyl, amino, mercapto, acrylic, and methacrylic groups. R may contain a nitrogen atom, and may be, for example, an amine group. The amine group may be a primary, secondary, tertiary, or quaternary group.

In Chemical Formula 1, each R may independently be one selected from hydrogen, a C1 to C10 alkyl, aryl, alkylaryl, arylalkyl, alkenyl, cycloalkenyl, alkene, alkylene, arylene, alkylarylene, arylalkylene, and cycloalkylene. In one or more embodiments, each R may independently be hydrogen or a linear or branched C1 to C6 alkyl group.

In Chemical Formula 1, R' may be bonded with an organic material, and at least one OR may be chemically bonded with an inorganic material. For example, at least one OR of Chemical Formula 1 may be converted to a hydroxyl group which may then react with the inorganic material to form a reaction product of the hydroxyl group with the inorganic material.

Because a compound of Chemical Formula 1 may be included in the first adhesive layer 710, the peel force of the first adhesive layer 710 having low creep may be improved in a high temperature and high humidity environment. Accordingly, reliability may be secured when the display device is folded.

Figure 2:
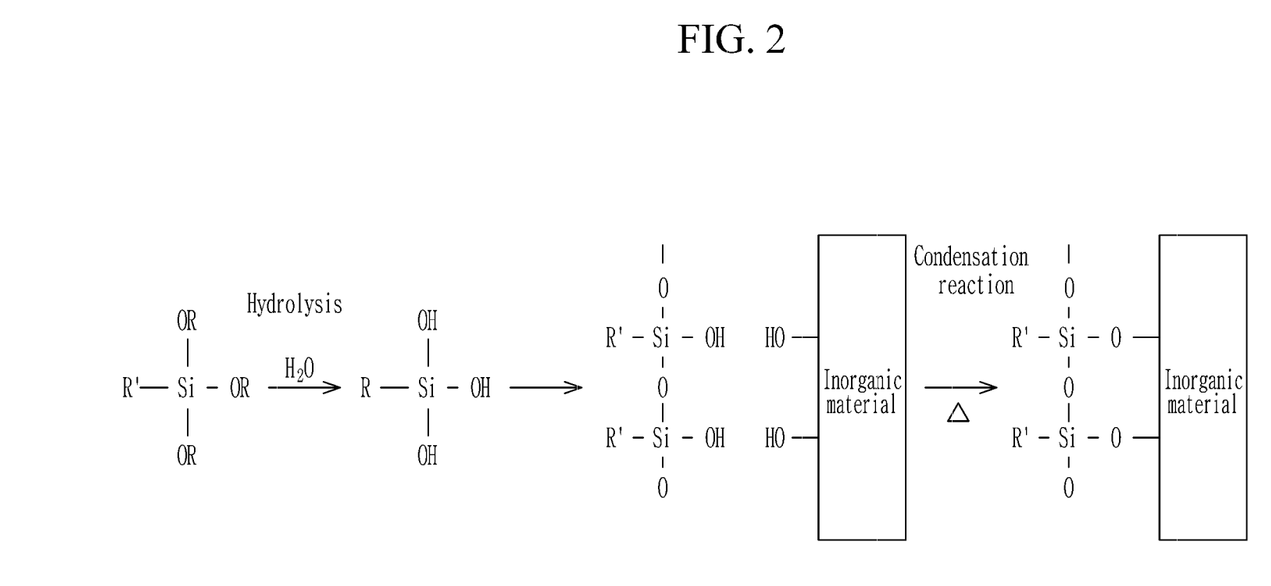
FIG. 2 illustrates a schematic diagram showing a process in which an silane coupling agent according to one or more embodiments is combined with an inorganic material.

FIG. 2 illustrates a schematic diagram showing a process in which a compound of Chemical Formula 1 according to one or more embodiments is combined with an inorganic material. The compound according to one or more embodiments may be bonded with an inorganic material through hydrolysis and condensation reactions as illustrated in FIG. 2. As illustrated in FIG. 2, the compound of Chemical Formula 1 according to one or more embodiments may be bonded with, for example, an ultra-thin glass (UTG) window and may increase the peel force between the window UTG and the first adhesive layer 710.

In one or more embodiments, a content (e.g., weight) of the silane coupling agent included in the first adhesive layer 710 may be in a range of 0.05 wt % to 1 wt %. In one or more embodiments, the content (e.g., weight) of the compound of Chemical Formula 1 may be in a range of 0.05 wt % to 1 wt %. When the content (e.g., weight) of the compound of Chemical Formula 1 is less than 0.05 wt %, it may not have a sufficient effect of improving the peel force, and when the content (e.g., weight) of the compound of Chemical Formula 1 is more than 1 wt %, the releasability may increase due to reduced adherence.

As described above, in the display device according to one or more embodiments, the first adhesive layer 710 at an uppermost end of the display device may include the compound represented by Chemical Formula 1, and may have a low creep (creep of 20% or less at 60° C.) and a high peel force at a high temperature (300 gf/in or less at 60° C.). Therefore, it may be easy to handle during a manufacturing process, and it may have high reliability in use.

Figure 3:
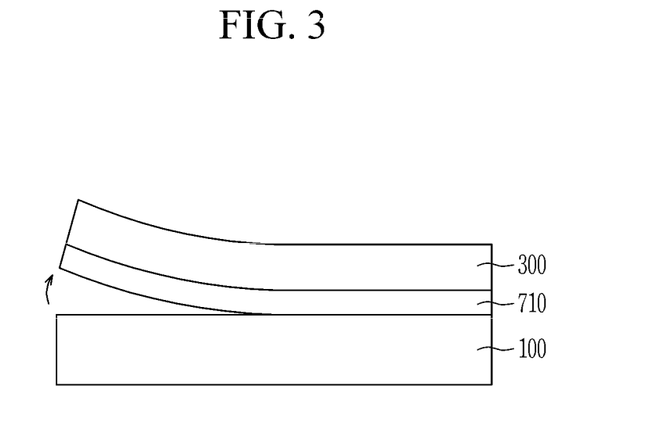
FIG. 3 illustrates a rework process for removing a protection layer.

When the protective layer 300 is incorrectly attached in an attaching process of the display panel 100, a rework process of removing the protective layer 300 may be required. FIG. 3 illustrates a rework process for removing a protection layer 300. Accordingly, in one or more embodiments where the first adhesive layer 710 may be used for attaching the protective layer 300, it is desirable to have characteristics of a low peel force at a high temperature, and having high reliability in a high temperature and high humidity environment. In addition, because the display device according to one or more embodiments is a foldable display device, an adhesive having low modulus and high creep has been used in order to have reliability in folding. However, in the case of using an adhesive having high creep, the first adhesive layer 710 is stamped or pushed by an external impact during a manufacturing process, so it may not be not suitable. In addition, because the peel force at a high temperature may be low, there may be a problem in that the display device may be peeled off when the temperature increases during use.

However, in the case of the display device according to one or more embodiments, the first adhesive layer 710 includes a compound represented by Chemical Formula 1 to improve peel force and reduce creep in a high temperature and high humidity environment. Therefore, it is possible to reduce pressing and imprinting defects in the manufacturing process, and the peel force in the high temperature and high humidity environment is improved, thereby improving reliability in the use environment.

Table 1 shows results of measuring single product reliability and surface pressing characteristics for various examples and comparative examples having different creep and peel force of the first adhesive layer 710.

TABLE 1

|  |  | Example 1 | Comparative Example 1 | Comparative Example 2 | Comparative Example 3 |
|---|---|---|---|---|---|
| Thickness (μm) |  | 35 | 35 | 35 | 35 |
| Creep (%) | 60° C. | <20% | 95 ± 10 | 40 ± 10 | <20% |
| Peel force (gf/In) of PI window | RT 25° C. | 544 ± 30 | 355 ± 7 | 315 ± 8 | 447 ± 6 |

TABLE 1-continued

|  | Example 1 | Comparative Example 1 | Comparative Example 2 | Comparative Example 3 |
|---|---|---|---|---|
| 60° C. (10 min) | 277 ± 10 | 130 ± 5 | 104 ± 16 | 157 ± 8 |
| 60° C. (Humidity of 93%) | 245 ± 15 | 88 ± 11 | 96 ± 3 | 140 ± 8 |
| Single product reliability (THB Folding) 60° C./93% THB: 150K times | OK | NG 3F/3 Buckling & coagulation destruction | NG 1F/3 Buckling | NG 3F/3 Buckling |
| Surface pressing characteristic* stacked in same 700 μm Depth of pressing under load of 500 gf | 7 μm | 23 μm | 15 μm | 7.5 μm |

The single product reliability test was performed by folding and unfolding a structure of display panel/adhesive/polyimide window 150,000 times under conditions of a temperature of 60° C. and humidity of 93%. As can be seen from Table 1, in Example 1, the creep is as low as 20% or less and the peel force at a high temperature and high humidity is high, and thus, it passes a reliability test, and the pressing is also lowest.

In the case of Comparative Example 1, the creep is higher than 90% and the peel force at the high temperature and high humidity is low, so buckling and cohesion failure phenomenon occur during the reliability test.

Similarly, in the case of Comparative Example 2, although the creep is at a level of 45%, which is more than half lower than that of Comparative Example 1, the peel force at the high temperature and high humidity is low, and thus, a buckling phenomenon occurs during the reliability test.

In the case of Comparative Example 3, the creep is at a level similar to that of Example 1, but the peel force at the high temperature and high humidity is low, and thus a buckling phenomenon occurs during the reliability test.

For example, it can be seen that the adhesive having the creep of a certain value or less and the peel force of a certain value or more, as in Example 1, improves a surface pressing characteristic and provides high reliability.

Figure 4:
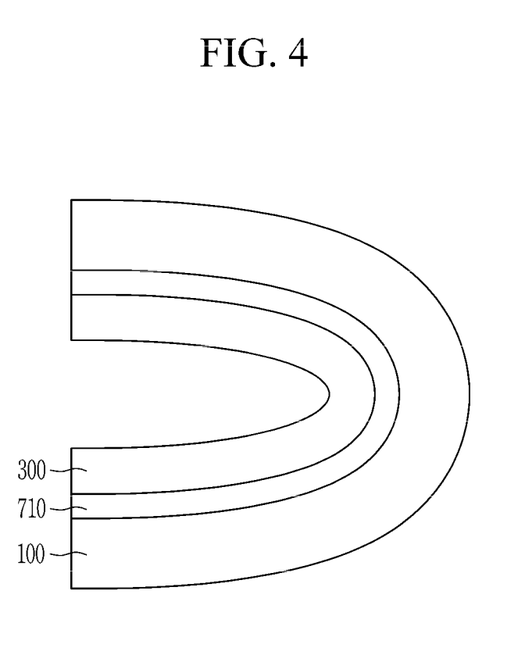
FIG. 4 illustrates a display device according to one or more embodiments.

FIG. 4 illustrates a display device according to one or more embodiments. Referring to FIG. 4, the display device according to one or more embodiments may be a foldable display device. As illustrated in FIG. 4, because the protective layer 300 and the first adhesive layer 710 may be on an uppermost layer, they may be bent and may be most vulnerable to stress at a bent portion. However, because the display device according to one or more embodiments includes the first adhesive layer 710 having low creep and a high peel force, reliability is excellent in the bent portion. Thus, the display device including the first adhesive layer according to one or more embodiments is suitable to be applied to a foldable display device. For example, the first adhesive layer according to one or more embodiments may be applied to a foldable display device having a radius of curvature of 1.5 R or more, and may be applied to both in-folding and out-folding (e.g., the foldable display device may be folded toward the protective layer 300 and the first adhesive layer 710, or may be folded away from the protective layer 300 and the first adhesive layer 710).

Figure 5:
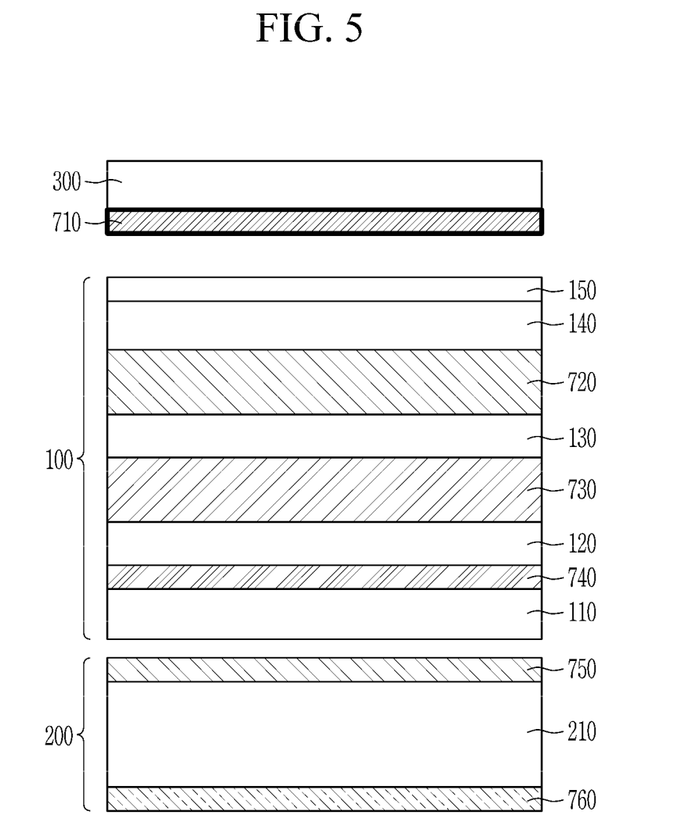
FIG. 5 illustrates a cross-sectional view of a display device according to one or more embodiments.

Hereinafter, a detailed stack structure of the display device according to one or more embodiments will be described in more detail with reference to FIG. 5. FIG. 5 illustrates a cross-sectional view of a display device according to one or more embodiments.

Referring to FIG. 5, the display device according to one or more embodiments includes a display panel 100, a support portion 200 positioned below the display panel 100, and a protective layer 300 positioned above the display panel 100. For better comprehension and ease of description, the display panel 100, the support portion 200, and the protective layer 300 are illustrated as being separated from each other, but may actually contact (e.g., physically contact) each other to be connected to each other as one unit.

Referring to FIG. 5, the protective layer 300 and the display panel 100 may be attached through the first adhesive layer 710. A description of the first adhesive layer 710 may be the same as described above, and thus, duplicative description thereof will not be repeated here. A thickness of the protective layer 300 may be in a range of 45 μm to 65 μm.

The display panel 100 may include a film layer 110, a display layer 120, a polarization layer 130, a window 140, and a hard coating layer 150, and may include a plurality of adhesive layers positioned between the layers. A stacked structure of the display panel 100 is merely an example, and some structures may be omitted according to one or more embodiments. For example, the polarization layer 130 may be omitted.

The film layer 110 and the display layer 120 may be attached by using a fourth adhesive layer 740. In this case, a thickness of the fourth adhesive layer 740 may be in a range of 5 μm to 15 μm. The fourth adhesive layer 740 may have a composition and characteristics that are different from those of the first adhesive layer 710. That is, the first adhesive layer 710 may contain the compound represented by Chemical Formula 1 and have a low creep characteristic and a high peel force, while the fourth adhesive layer 740 may not contain the compound represented by Chemical Formula 1 and may have a creep characteristic and a peel force that are different from those of the first adhesive layer 710.

The display layer 120 may be a layer in which transistors and light emitting elements are electrically coupled to substantially display an image. A thickness of the display layer 120 may be in a range of 30 μm to 40 μm.

The display layer 120 and the polarization layer 130 may be bonded by using a third adhesive layer 730. A thickness of the third adhesive layer 730 may be in a range of 40 μm to 60 μm. The third adhesive layer 730 may have a composition and characteristics that are different from those of the first adhesive layer 710. For example, the first adhesive layer 710 may contain the compound represented by Chemical Formula 1 and have a low creep characteristic and a high peel force, while the second adhesive layer 720 may not contain the compound represented by Chemical Formula 1 and may have a creep characteristic and a peel force that are different from those of the first adhesive layer 710.

A thickness of the polarization layer 130 may be in a range of 20 μm to 40 μm. The polarization layer 130 may be omitted according to one or more embodiments.

The polarization layer 130 and the window 140 may be bonded by using the second adhesive layer 720. A thickness of the second adhesive layer 720 may be in a range of 40 μm to 60 μm. The second adhesive layer 720 may have a composition and characteristics that are different from those of the first adhesive layer 710. For example, the first adhesive layer 710 may contain the compound represented by Chemical Formula 1 and have a low creep characteristic and a high peel force, while the second adhesive layer 720 may not contain the compound represented by Chemical Formula 1 and may have a creep characteristic and a peel force that are different from those of the first adhesive layer 710.

A coating layer 150 may be on the window 140. The coating layer 150 may include an acryl-based material. A thickness of the coating layer 150 may be in a range of 5 μm to 15 μm.

The support portion 200 includes a cushion layer 210, and a fifth adhesive layer 750 and a sixth adhesive layer 760 at opposite sides of the cushion layer 210. The cushion layer 210 may include polyurethane foam. A thickness of the cushion layer 210 may be in a range of 70 μm to 90 μm.

The cushion layer 210 and the film layer 110 may be attached through a fifth adhesive layer 750. A thickness of the fifth adhesive layer 750 may be in a range of 20 μm to 30 μm. The fifth adhesive layer 750 may have a composition and characteristics that are different from those of the first adhesive layer 710. For example, the first adhesive layer 710 may contain the compound represented by Chemical Formula 1 and have a low creep characteristic and a high peel force, while the fifth adhesive layer 750 may not contain the compound represented by Chemical Formula 1 and may have a creep characteristic and a peel force that are different from those of the first adhesive layer 710.

A thickness of the sixth adhesive layer 760 may be in a range of 20 μm to 30 μm. The sixth adhesive layer 760 may have a composition and characteristics that are different from those of the first adhesive layer 710. For example, the first adhesive layer 710 may contain the compound represented by Chemical Formula 1 and have a low creep characteristic and a high peel force, while the sixth adhesive layer 760 may not contain the compound represented by Chemical Formula 1 and may have a creep characteristic and a peel force that are different from those of the first adhesive layer 710.

As described above, in the display device according to one or more embodiments, the adhesive layer at an uppermost layer of the display device may contain a silane coupling agent represented by Chemical Formula 1, and may have a low creep characteristic and a high peel force. Therefore, it is possible to minimize or reduce the pressing defect that occurs when the creep is high in the manufacturing process, and because the peel force is high, reliability in the use environment may be secured. For example, the display panel and the protective layer may be stably bonded at a folding portion of a foldable display device.

While the subject matter of this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims, and their equivalents.

| Description of Symbols | |
|---|---|
| 100: display panel | 110: film layer |
| 120: display layer | 130: polarization layer |
| 140: window | 200: support portion |
| 210: cushion layer | 300: protection layer |

| Description of Symbols | |
|---|---|
| 710: first adhesive layer | 720: second adhesive layer |
| 730: third adhesive layer | 740: fourth adhesive layer |
| 750: fifth adhesive layer | 760: sixth adhesive layer |

What is claimed is:

1. A display device comprising:
a display panel;
a protection layer on the display panel;
a first adhesive layer between the display panel and the protection layer; and
a hard coating layer;
wherein the hard coating layer and the first adhesive layer directly contact each other,
wherein the first adhesive layer contains 0.05 wt % to 1 wt % of a silane coupling agent,
wherein the first adhesive layer has creep of 20% or less at 60° C., and
wherein the silane coupling agent comprises a compound represented by following Chemical Formula 1:

Chemical Formula 1 wherein R' indicates one selected from a C1 to C10 alkyl, vinyl, carboxyl, glycidyl, epoxy, glycidyl, amino, mercapto, acrylic, methacrylic, primary amine, secondary amine, tertiary amine, and quaternary amine, and R' is bonded with an organic material of the first adhesive layer, and each R independently indicates one selected from hydrogen, a C1 to C10 alkyl, aryl, alkylaryl, arylalkyl, alkenyl, cycloalkenyl, alkene, alkylene, arylene, alkylarylene, arylalkylene, and cycloalkylene, and at least one OR is a hydroxyl group that has been reacted with an inorganic material of the hard coating layer to form a reaction product of the hydroxyl group and the inorganic material.

2. The display device of claim 1, wherein a thickness of the first adhesive layer is in a range of 25 μm to 100 μm.

3. The display device of claim 1, wherein the display panel further comprises a display layer, and a window.

4. The display device of claim 3, further comprising a second adhesive layer between the display layer and the window, and
wherein the hard coating layer and the first adhesive layer have different compositions.

5. The display device of claim 1, wherein the first adhesive layer is at an uppermost end of a plurality of adhesive layers included in the display device.

6. The display device of claim 1, wherein the first adhesive layer comprises a pressure sensitive adhesive (PSA).

7. The display device of claim 3, wherein the window contains a polyimide, and
wherein the first adhesive layer has a peel force of 500 gf/in or more with respect to the window at 25° C.

8. The display device of claim 7, wherein the first adhesive layer has a peel force of 514 gf/in to 574 gf/in at 25° C. with respect to the window.

9. The display device of claim 3, wherein the window contains a polyimide, and
wherein the first adhesive layer has a peel force of 300 gf/in or less with respect to the window at 60° C.

10. The display device of claim 9, wherein the first adhesive layer has a peel force of 267 gf/in to 287 gf/in at 60° C. with respect to the window.

11. The display device of claim 1, wherein the first adhesive layer has a storage modulus of 0.02 MPa to 0.035 MPa at 60° C.

12. The display device of claim 1, wherein a glass transition temperature of the first adhesive layer is −30° C. or less.

13. The display device of claim 1, wherein the first adhesive layer is a double-sided adhesive layer.

14. The display device of claim 1, wherein the display device is foldable.

15. The display device of claim 14, wherein A radius of curvature of the foldable display device is 1.5 R or more.

16. The display device of claim 4, further comprising:
a polarization layer between the display layer and the window;
a third adhesive layer between the display layer and the polarization layer;
a film layer on a surface of the display layer; and
a fourth adhesive layer between the display layer and the film layer.

17. The display device of claim 16, wherein the compositions of the third and fourth adhesive layers are different from that of the first adhesive layer.

18. The display device of claim 16, further comprising:
a cushion layer on a surface of the display layer; and
a fifth adhesive layer to attach the cushion layer and the display panel,
wherein a composition of the fifth adhesive layer is different from that of the first adhesive layer.

19. A display device comprising:
a display panel;
a protection layer on the display panel;
a first adhesive layer between the display panel and the protection layer; and
a hard coating layer;
wherein the hard coating layer and the first adhesive layer directly contact each other,
wherein the first adhesive layer contains 0.05 wt % to 1 wt % of a compound represented by Chemical Formula 1, and
the first adhesive layer has creep of 20% or less at 60° C.:

$$R'-Si-(OR)_3 \qquad \text{Chemical Formula 1}$$

wherein R' indicates one selected from a C1 to C10 alkyl, vinyl, carboxyl, glycidyl, epoxy, glycidyl, amino, mercapto, acrylic, methacrylic, primary amine, secondary amine, tertiary amine, and quaternary amine, and R' is bonded with an organic material of the first adhesive layer, and each R independently indicates one selected from hydrogen, a C1 to C10 alkyl, aryl, alkylaryl, arylalkyl, alkenyl, cycloalkenyl, alkene, alkylene, arylene, alkylarylene, arylalkylene, and cycloalkylene, and at least one OR is a hydroxyl group that has been reacted with an inorganic material of the hard coating layer to form a reaction product of the hydroxyl group and the inorganic material.

* * * * *